United States Patent
Rayman et al.

(10) Patent No.: US 7,616,008 B1
(45) Date of Patent: Nov. 10, 2009

(54) DIGITAL AUTO BALANCE BRIDGE

(75) Inventors: Michael D. Rayman, Akron, OH (US); Gregory Sobolewski, Seven Hills, OH (US); Wayne C. Goeke, Hudson, OH (US)

(73) Assignee: Keithley Instruments, Inc., Cleveland, OH (US)

( * ) Notice: Subject to any disclaimer, the term of this patent is extended or adjusted under 35 U.S.C. 154(b) by 145 days.

(21) Appl. No.: 11/757,756

(22) Filed: Jun. 4, 2007

(51) Int. Cl.
*G01R 27/02* (2006.01)

(52) U.S. Cl. ................................. 324/607; 324/647

(58) Field of Classification Search .................. 324/607, 324/610, 648, 651, 657, 666
See application file for complete search history.

(56) References Cited

U.S. PATENT DOCUMENTS 5,307,284 A * 4/1994 Brunfeldt et al. .............. 702/76

2004/0027118 A1 * 2/2004 Lenz et al. ............. 324/207.26

OTHER PUBLICATIONS

Efficient Microwave Bias and Testing Using the HP 4142B Modular DC Source/Monitor. Hewlett Packard. Application Note 1205 (Date: At least as early as Aug. 30, 2006.).

* cited by examiner

*Primary Examiner*—Vincent Q Nguyen
(74) *Attorney, Agent, or Firm*—Pearne & Gordon LLP

(57) ABSTRACT

An AC impedance measurement system is used for measuring the impedance of a DUT. A measured voltage is applied to a first DUT terminal by a first digital to analog converter, the voltage appearing at the second terminal of the DUT is monitored through an analog to digital converter and forced by a second digital to analog converter to a desired negligible value, and a digital controller determines the impedance of the DUT from the measured voltage and the current necessary to force the voltage appearing at the second terminal to the desired negligible value.

4 Claims, 1 Drawing Sheet

DIGITAL AUTO BALANCE BRIDGE

BACKGROUND OF THE INVENTION

The present invention relates to electrical measurements and, in particular, to precision AC measurements.

It is common to use an analog-based auto balance bridge technique in precision AC impedance measurements. In such measurements, a voltage signal is applied to one terminal of an impedance and an analog feedback loop is used at the second terminal to zero out any resulting voltage at the second terminal. The current provided by the loop is measured to determine the current through the impedance resulting from the voltage signal, and hence, the impedance is determined by the ratio. Because the second terminal is at a virtual ground, the measurement technique eliminates the effects of, for example, stray capacitances to ground, as there is no potential difference between the virtual ground and the actual ground.

SUMMARY OF THE INVENTION

An AC impedance measurement system for measuring the impedance of a DUT having a first and a second terminal includes a digital controller; a first digital to analog converter for converting digital signals from the digital controller to analog signals for application to the first terminal; a second digital to analog converter for converting digital signals from the digital controller to analog signals for application to the second terminal; and an analog to digital converter for converting analog signals from the second terminal to digital signals to the digital controller. A measured voltage is applied to the first terminal by the first digital to analog converter, the voltage appearing at the second terminal is monitored through the analog to digital converter and forced by the second digital to analog converter to a desired negligible value, and the digital controller determines the impedance of the DUT from the measured voltage and the current necessary to force the voltage appearing at the second terminal to the desired negligible value.

DESCRIPTION OF THE PREFERRED EMBODIMENTS

Figure 1:
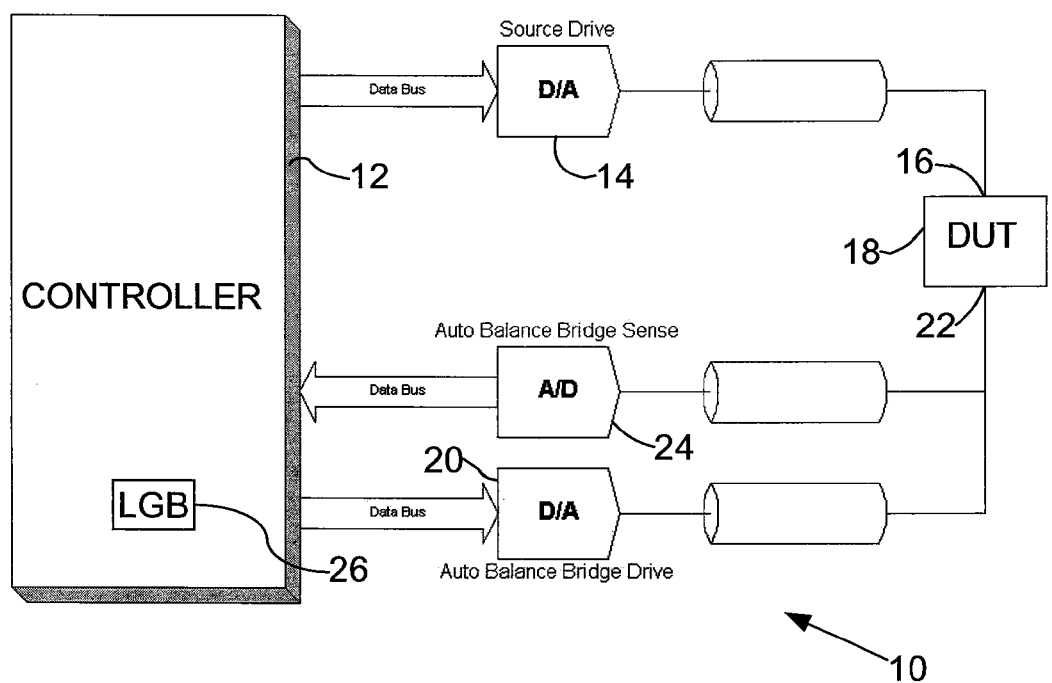
FIG. 1 is a schematic diagram of an example of a system according to the invention.

Referring to FIG. 1, an AC measurement system 10 includes a digital controller 12, a digital to analog (D/A) converter 14 for converting digital signals from the controller 12 to analog signals for application to a terminal 16 of a device under test (DUT) 18, a digital to analog (D/A) converter 20 for converting digital signals from the controller 12 to analog signals for application to a second terminal 22 of the DUT 18, and an analog to digital (A/D) converter 24 for converting analog signals from the terminal 22 to digital signals to the controller 12.

The controller 12 may be, for example, a field programmable gate array (FPGA), a microprocessor based computer, or a digital signal processing device.

To measure an impedance of the DUT 18, the controller 12 applies a measured voltage to the DUT 18 via the D/A converter 14. The controller 12, working through the D/A converter 20 and the A/D converter 24, operates a feedback loop that holds the terminal 22 at a virtual ground which is a negligible value with respect to zero. The path of the A/D converter 24 monitors the voltage at the terminal 22 and the path of the D/A converter 20 forces the voltage at the terminal 22 to the negligible value. The controller 12 determines the impedance of the DUT 18 from the measured voltage at the terminal 16 and the current necessary to force the voltage at the terminal 22 to the negligible value (e.g., Ohm's Law). Because the terminal 22 is effectively at zero potential, the effects of leakage impedances to ground are avoided, resulting in an improved measurement of the impedance of the DUT 18.

An important parameter in feedback loops is the loop gain bandwidth. If it is too small, the loop does not lock and if it is too high, the loop will be unstable (e.g., oscillate). In one embodiment of the system 10, the controller 12 monitors the state of the feedback loop (e.g., the load conditions of the DUT) and adjusts the loop gain bandwidth (LGB) 26 to a functional value. This is made possible by the digital implementation of the feedback loop. In an analog loop, providing a variable loop gain bandwidth would require substantial additional circuitry, space and power, as well as introduce further issues of calibration, leakage and noise. Instead, the controller 12 only needs to adjust the digital parameters of the loop to adjust the loop gain bandwidth.

It should be noted that because of the duality of voltage and current, it is possible interchange currents for voltages and vice versa and still remain within the scope of the invention.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed is:

1. An AC impedance measurement system for measuring the impedance of a DUT having a first and a second terminal, said system comprising:
    a digital controller;
    a first digital to analog converter for converting digital signals from said digital controller to analog signals for application to said first terminal;
    a second digital to analog converter for converting digital signals from said digital controller to analog signals for application to said second terminal; and
    an analog to digital converter for converting analog signals from said second terminal to digital signals to said digital controller, wherein a measured voltage is applied to said first terminal by said first digital to analog converter, the voltage appearing at the second terminal is monitored through the analog to digital converter and forced by the second digital to analog converter to a desired negligible value, and the digital controller determines the impedance of the DUT from the measured voltage and the current necessary to force the voltage appearing at the second terminal to said desired negligible value.

2. An AC impedance measurement system according to claim 1, wherein said digital controller includes a digitally adjustable loop gain bandwidth that is responsive to the load conditions of the DUT.

3. An AC impedance measurement system according to claim 1, wherein said digital controller is a FPGA.

4. An AC impedance measurement system according to claim 1, wherein said digital controller is a microprocessor based computer.

* * * * *